United States Patent
Beery et al.

[11] Patent Number: 4,963,459
[45] Date of Patent: Oct. 16, 1990

[54] SYSTEM FOR REGISTERING TO A MOVING WEB

[75] Inventors: Jack Beery, Centerville; David A. Boyer, Miamisburg, both of Ohio

[73] Assignee: The Mead Corporation, Dayton, Ohio

[21] Appl. No.: 399,434

[22] Filed: Aug. 25, 1989

Related U.S. Application Data

[63] Continuation of Ser. No. 287,540, Dec. 16, 1988, abandoned, which is a continuation of Ser. No. 106,202, Oct. 8, 1987, abandoned.

[51] Int. Cl.$^5$ .......................... G03C 1/68; G03C 1/72
[52] U.S. Cl. .................................. 430/138; 430/211; 430/350; 430/460; 428/327
[58] Field of Search ............... 430/138, 211, 460, 350; 428/327; 346/207, 214

[56] References Cited

U.S. PATENT DOCUMENTS

| | | | |
|---|---|---|---|
| 3,439,176 | 4/1969 | Astley et al. | 250/219 |
| 3,645,619 | 2/1972 | Burton et al. | 355/40 |
| 3,820,884 | 6/1974 | Sone et al. | 353/26 |
| 4,399,209 | 8/1983 | Sanders et al. | 430/138 |
| 4,440,846 | 4/1984 | Sanders et al. | 430/138 |
| 4,519,868 | 5/1985 | Hoffmann | 156/353 |
| 4,532,596 | 7/1985 | Pugsley | 364/469 |
| 4,578,340 | 3/1986 | Saccocio et al. | 430/138 |

Primary Examiner—Paul R. Michl
Assistant Examiner—Patrick Doody
Attorney, Agent, or Firm—Thomas A. Boshinski

[57] ABSTRACT

The present invention provides a method of registering to an imaging web moving within an imaging web handling apparatus along an imaging web path. The imaging web comprises a support having a coating of photosensitive microcapsules on the surface thereof. The photosensitive microcapsules have an internal phase of a photosensitive composition and a color former. Exposure of the imaging web to actinic radiation defines an image area and a border area.

A registration mark is formed on the web by exposing a portion of the web area to actinic radiation so that the portion undergoes a color or reflection change, or exposing all but a portion of the border area to actinic radiation so that the exposed area undergoes a color or reflection change. The registration mark is detected and in response to detection of the registration mark, an operation is performed on the imaging web.

16 Claims, 2 Drawing Sheets

SYSTEM FOR REGISTERING TO A MOVING WEB

This is a continuation of Ser. No. 287,540 filed Dec. 16, 1988, now abandoned, which is a continuation of Ser. No. 106,202 filed Oct. 8, 1987, now abandoned.

Background of the Invention

The present invention relates generally to web handling methods and apparatus, and more particularly, to such methods and apparatus in which operations performed on the web must be properly registered with the web.

A number of web-handling devices are known in which proper registration of the web with another web, with sheets, or with the device itself is required. The exact function of these devices depends upon the nature of the web material which is to be handled, as well as the particular operation to be carried out.

One type of web material is disclosed in commonly assigned U.S. Pat. Nos. 4,399,209 and 4,440,846, which describe an imaging media for use with an imaging system. The imaging media comprise a support having a coating of photosensitive microcapsules on the surface thereof. The microcapsules contain an internal phase of a photosensitive composition and a color former The photosensitive microcapsules are image-wise exposed to actinic radiation and subjected to a uniform rupturing force whereupon the microcapsules rupture and image-wise release the internal phase. When the microcapsules rupture, the color former image-wise reacts with a developer material and produces a color image. In the embodiments described in the referenced patents, the microcapsules are typically ruptured by passing an image-wise exposed imaging web through the nip between a pair of parallel calender rolls.

This photosensitive media may exist in a form which comprises two sheet-like layers. The microcapsules are carried on a first substrate layer which is most conveniently provided in the form of a continuous web. The developer material is typically coated onto a second separate support in the form of separate sheets wherein each sheet is referred to as a receiver sheet. The imaging web is subjected to the actinic radiation and the exposed microcapsule layer is then brought into contact with the developer layer of the receiver sheets. The receiver sheet and imaging web are developed by pressure with the finished image being formed in the receiver sheet It will be readily recognized that when the receiver sheet is brought into contact with the imaging web, the receiver sheet must be accurately registered with the web; otherwise, the finished image will be formed on the receiver sheet in an offset or misaligned position. Once the donor web has been exposed to actinic radiation, the location of the image on the web has been fixed. Thus, the receiver sheet must be properly positioned with respect to the imaging web in order to correspond to the exposed image.

A variety of registration systems which operate on moving webs are known For example, see U.S. Pat. Nos. 3,439,176 and 4,532,596 (register control when printing on a web); 3,645,619 (register control when positioning film in reproduction apparatus); 3,820,884 (register control when searching on a roll of microfilm); and 4,519,868 (register control when cutting a roll of labels). In general, for such registration systems to operate properly, accurate data concerning the positioning of the web must be available. For example, in the case of the photosensitive media described above, both the positioning of the exposed portion of the web with respect to the web, and the overall positioning of the web with respect to the apparatus must be known in order for the sheet to be brought properly into position.

A significant problem is encountered in registering receiver sheets with the imaging web of the media described above. This problem results from the fact that the imaging web must be stationary at the exposure station where the image is exposed onto the imaging web. At the same time, developing is best carried out by continuously moving the imaging web and receiver sheet through the pressure rolls. Rapid and frequent starting and stopping of the imaging web during movement through the pressure rolls can affect the uniformity of the pressure applied to the imaging web which adversely affects the developing process. Thus, advancing of the imaging web between separate exposures, and advancing the imaging web through the developer rolls, are most advantageously done independently.

It is known to monitor the positioning of a moving imaging web by connecting a rotary positional encoder with the drive used for moving the imaging web. However, this approach is effective only where the entire web-handling apparatus is operated by a common drive. In the case of the microencapsulated photosensitive media, the web may be advanced from the exposure station independent of the developer station. The web may also be retracted at the exposure station independent of the developer station. As an example, the web may be directed into a web reservoir after leaving the exposure station. The web in the web reservoir may then be reversed so that the gap between adjacent image areas is small for economical reasons, and as such, registration of the web at the exposure station is required. Also, the receiver sheet, which must be brought into contact with the web at the developer station, is registered in accordance with the exposure provided at the exposure station on the imaging web. Thus, it is not possible to monitor web position in the conventional manner using an encoder.

Although it is known in the printing art to print a visible registration mark, the formation of a visible registration mark in the aforementioned photosensitive imaging web would be useless for web re registration or receiver sheet registration purposes. Although the image-wise exposure generates a latent image in the photosensitive imaging web, the latent image is not developed into a visible image on the receiver sheet until after the web has been re-registered or the receiver sheet is already in contact with the imaging web.

A system for registering sheets with a moving web which can be used in a web handling apparatus in which operations are performed on the web independent of each other is needed. The system needs to be capable of registering sheets with the web at a second station based upon operations on the web at a first station. Specifically, the system should be useable with a photosensitive web which is exposed at the first station and registered with a receiver sheet at the second station.

Summary of the Invention

The present invention provides a method of registering to an imaging web moving within an imaging web handling apparatus along an imaging web path. The imaging web comprises a support having a coating of photosensitive microcapsules on the surface thereof. The photosensitive microcapsules have an internal phase of a photosensitive composition and a color former. Exposure of the imaging web at an exposure station to actinic radiation defines an image area and a border area.

It has been found that upon exposure of the photosensitive microcapsules to actinic radiation, the photosensitive microcapsules undergo a detectable color and/or reflection change. More specifically, upon exposure to actinic radiation, the internal phase of the photosensitive microcapsules shrinks as a result of polymerization. This shrinking results in a detectable color and/or reflection change. As a result of the foregoing, it has been found that a registration mark can be formed by exposure of the web to actinic radiation to generate a detectable color or reflection change so as to provide a means of registration. More specifically, the registration mark is formed at a position fixed relative to the image area so that upon reversing or advancing the web and later detection of the registration mark by a detector, the position of the image area on the imaging web is known in order for proper registration.

The exact location, shape, and size of the registration mark can be varied as long as a detector can detect a difference between the registration mark and the surrounding web area. As examples of potential locations for the registration mark, the registration mark can be formed on the perimeter of the image areas ("natural" registration mark); or in the web border areas which comprise the areas between the ends of adjacent image areas, and the areas between the sides of image areas and the web edge ("artificial" registration mark). The term "natural" registration mark as used herein means a registration mark made on the image area perimeter as a natural result of image-wise exposure to create the image area. The term "artificial" registration mark as used herein means a registration mark made in the border area which is not the natural result of the image-wise exposure. The registration mark is formed on the web by exposing a first portion of the image area perimeter or the border area to actinic radiation so that the first portion undergoes a color or reflection change with respect to the remaining second portion of the image area perimeter or the border area. In one embodiment, the first portion is small relative to the second portion and the registration mark is formed by exposing the first portion of the image area perimeter or the border area to actinic radiation so that the first portion undergoes a color or reflection change; as such, when the imaging web subsequently passes beneath a detector, the detector senses a difference between the registration mark, which comprises an exposed area having undergone a color or reflection change, and the surrounding unexposed area.

In another embodiment, the second portion is small relative to the first portion and the registration mark is formed by exposing the first portion of the image area perimeter or the border area to actinic radiation so that the first portion undergoes a color or reflection change; as such, when the imaging web subsequently passes beneath a detector, the detector detects a difference between the registration mark, which comprises an unexposed area, and the surrounding area, which comprises an exposed area having undergone a color or reflection change. So, depending upon the application, the registration mark can be defined by an exposed or unexposed area.

Depending upon the application, the registration mark can be formed at any location within the imaging web handling apparatus. As examples, the registration mark can be formed before, at, or after the image-wise exposure station. Also, the registration mark can be formed simultaneously with the image areas or at a different time. Because of this wide latitude, the method of the present invention can be used wherever registration to an imaging web is required.

In response to detection of the registration mark by the detector, an operation is performed on the imaging web. For example, if the imaging web is directed into a web reservoir after image area and registration mark formation, the web in the reservoir may then be reversed so that the gap between adjacent image areas is small for economical reasons. In response to detection of the registration mark by the detector, the web would be stopped and image-wise exposed to create the next image area.

In another example, the operation performed on the imaging web would be feeding a receiver sheet into contact with the imaging web so as to correspond with the image area. Thus, upon subsequent development, the final image is properly positioned on the receiver sheet.

As another example, in response to detection of the registration mark by the detector, a bar code or number would be applied to the web.

In accordance with another embodiment, the present invention provides a transfer imaging process. An imaging web is image-wise exposed to actinic radiation to form an image area. The imaging web comprises a support having a coating of photosensitive microcapsules on the surface thereof. The photosensitive microcapsules have an internal phase of a photosensitive composition and a color former. The image-wise exposure defines a border area in the imaging web comprising the areas of the imaging web surrounding the image area.

A natural or artificial registration mark is formed by exposure of the web to actinic radiation. The web is advanced and the registration mark is then detected with a detector. In response to detection of the registration mark, a receiver sheet is fed into contact with the imaging web along the image area. The entire surface of the imaging web is then subjected to a uniform rupturing force such that the photosensitive microcapsules rupture and release the internal phase in accordance with the image-wise exposure to react with a developer material to produce an image.

In accordance with another embodiment, the present invention provides an apparatus for exposing an imaging web, registering with the imaging web, and developing the image areas of the imaging web. The imaging web comprises a support having a coating of photosensitive microcapsules on the surface thereof. The photosensitive microcapsules have an internal phase of a photosensitive composition and a color former.

The apparatus comprises:
an exposure station;
means for positioning the imaging web at the exposure station;
means at the exposure station for image-wise exposure of the photosensitive microcapsules on the imaging web such that an image area is formed wherein the image-wise exposure defines a border area in the imaging web comprising the areas of the imaging web surrounding the image area;
a developer station positioned beyond the exposure station and including developer means;

means for advancing the imaging web along a web path from the exposure station to the developer station;

means positioned adjacent to the web path before the developer station for exposure of the border area to form a registration mark;

a detector positioned along the web path after the means for exposure of the border area to form a registration mark and before the developer station for detecting the registration mark and generating a detector signal in response thereto;

control means connected to the optical detector for receiving the detector signal; and performing means connected to the control means wherein in response to the detector signal, the control means causes the performing means to perform an operation on the imaging web.

An object of the present invention is to provide a method and apparatus for registering on an imaging web.

A further object of the present invention is to provide a method for forming and detecting a registration mark so as to provide a means of registration.

Another object of the present invention is to provide a method for forming a registration mark wherein the registration mark can be formed at any location, within the web handling apparatus, which is before the development station.

An additional object of the present invention is to provide a method wherein image-wise exposure and formation of a registration mark occur simultaneously.

A more particular object of the present invention is to provide a method and apparatus for registering receiver sheets with the image areas on a microencapsulated photosensitive imaging web.

Other objects and advantages of the present invention will become apparent from the following description, attached drawings, and appended claims.

Detailed Description of the Invention

The method and apparatus of the present invention for registering receiver sheets to an imaging web moving within an imaging web handling apparatus along an imaging web path are used in conjunction with the photosensitive imaging media described in commonly assigned U. S. Pat. Nos. 4,399,209 and 4,440,846, which are hereby incorporated by reference. The media can have a reflective surface such as provided by metallizing, or more specifically, by aluminizing Such media can be seen by reference to FIGS. 1A-1C, wherein an imaging web 10 is constituted by a substrate 12 coated with microcapsules 14. The microcapsules 14 are filled with an internal phase 16 containing a photosensitive composition. Typically, the photosensitive composition includes a photoinitiator. Preferred photoinitiators are disclosed in commonly assigned U.S. Pat. No. 4,772,530 which is incorporated herein by reference. Usually, the microcapsules 14 also contain a color former; however, the color former can be associated with the microcapsules 14 in other ways, such as by incorporation into the microcapsule wall or in a layer contiguous with the microcapsules.

Figure 1A:
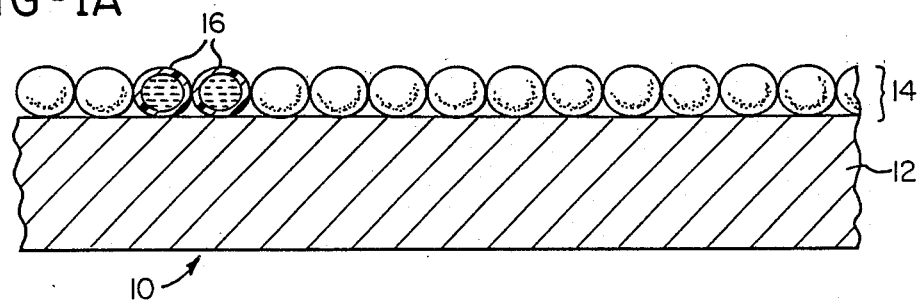
FIGS. 1A-1C are schematic illustrations in cross-section of an imaging web and receiver sheet for which the present invention is especially adapted, illustrating the imaging web, exposure of the web, and development of the image in the receiver sheet.

While shown in FIG. 1A, in actuality, the microcapsules 14 are not visible to the unaided eye, since the mean size of the microcapsules generally ranges from approximately 1-25 microns.

Figure 1B:
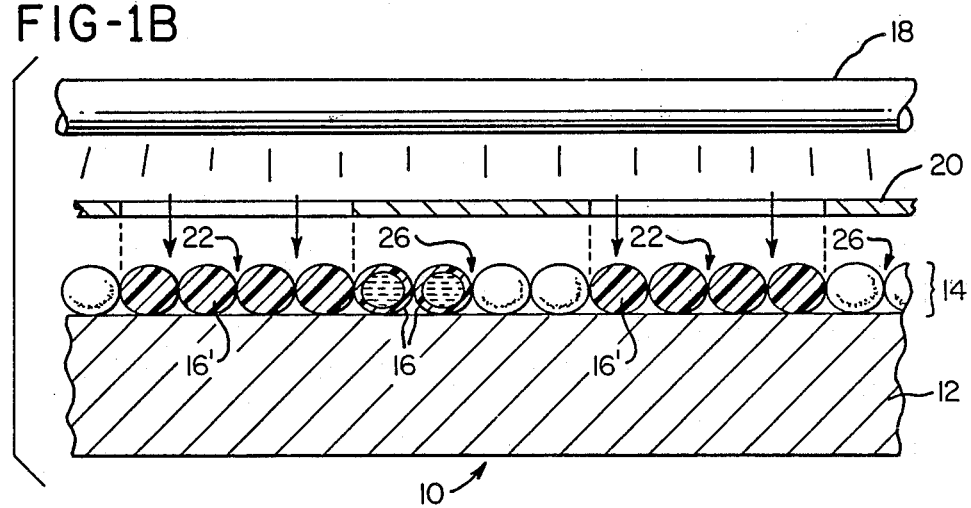

Exposure of the imaging web 10 by transmission imaging is shown in FIG. 1B. A source of radiant energy 18 is positioned above the surface of the imaging web 10 with a mask 20 positioned therebetween. As illustrated, the substrate 12 is opaque and the photosensitive material within the microcapsules 14 is a positive working radiation curable material, i.e., the viscosity of the material increased upon exposure to actinic radiation.

The radiation of the exposed areas 22 causes the radiation curable composition in the internal phase 16 of the microcapsules 14 to polymerize, thereby gelling, solidifying, or otherwise immobilizing the color former and preventing the color former from reacting with the developer material 24. Preferred developer materials are disclosed in commonly assigned U.S. Pat. application Ser. No. 905,727, filed Sept. 9, 1986 which is incorporated herein by reference. To simplify the illustration, internal phase 16' in the exposed areas 22 is shown as a solid, whereas the internal phase 16 remains liquid in the unexposed areas 26.

The imaging web 10 is next processed by subjecting the imaging web to a uniform rupturing force by means of a pair of pressure rollers in resilient pressure engagement with the imaging web along a nip. The imaging web is moved between the rollers such that the rollers supply a uniform force to substantially the entire width of the imaging web to rupture the microcapsules 14 such that the color former contained within the microcapsules 14 or otherwise associated therewith can interact with the developer material 24.

Figure 1C:
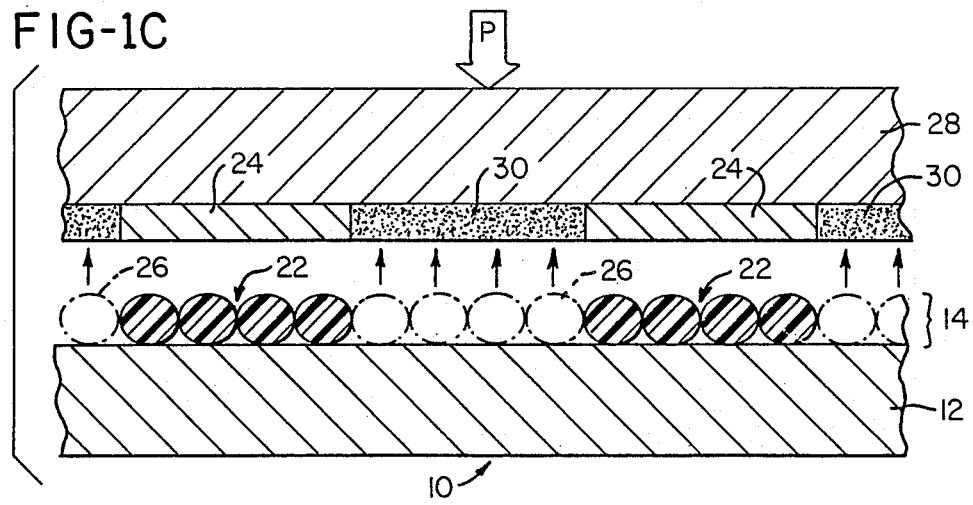

As shown in FIG. 1C, the necessary developer material 24 is formed as a layer of developer material on a separate substrate or receiver sheet 28. The receiver sheet 28 is aligned and in facing engagement with the transfer imaging web 10. As the uniform rupturing force is applied by the pressure rollers to the combination of the transfer imaging web 10 and the receiver sheet 28, the microcapsules 14 are ruptured and the internal phase migrates to the developer layer 24 of the receiver sheet 28, where it reacts with the developer material to form the image 30.

Figure 2:
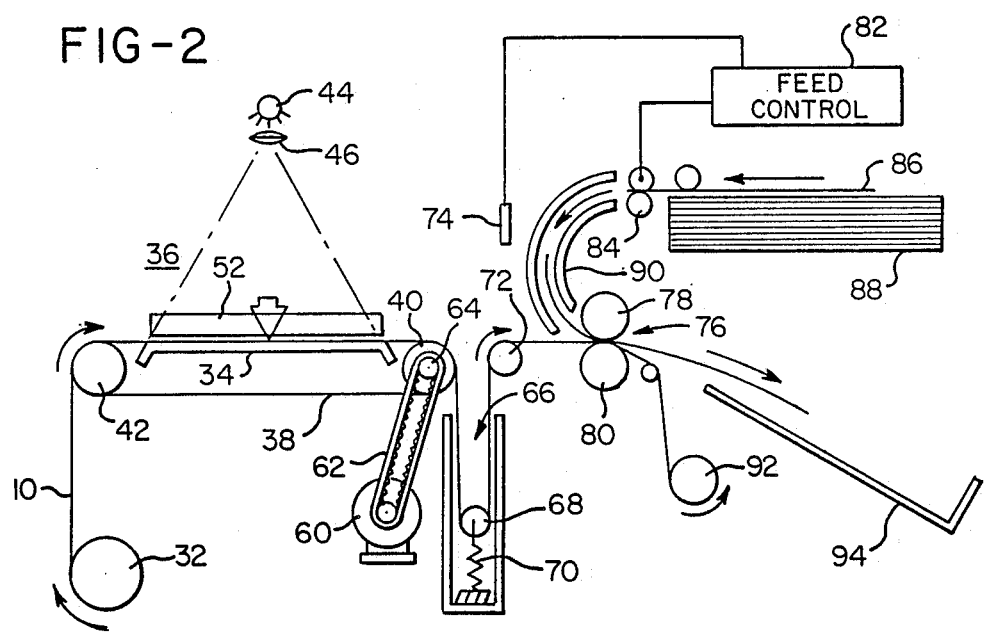
FIG. 2 is a schematic diagram of an apparatus for operating on a moving web, including means in accordance with the present invention for registering receiver sheets to the moving imaging web.

An apparatus with which the photosensitive media can be used is shown schematically in FIG. 2. The imaging web 10 is drawn from a supply roll 32 onto a platen 34 within an exposure station 36. In some situations, the platen 34 may be unnecessary because the web is just in tension. While within exposure station 36, imaging web 10 is located on an endless belt 38 extending around a drive roller 40 and an idler roller 42. When one frame, picture unit, or document is positioned at the exposure station 36, it is image-wise exposed to a source of actinic radiation 44 to form an image area on the imaging web 10. Preferably, the exposure is focused through lens 46. Typically, a screen, mask, baffle or the like is used to prevent exposure of the areas surrounding the image area, i.e., the border area. A useful means for preventing exposure of the border is disclosed in commonly assigned U.S. Pat. application Ser. No. 052,317.

Various forms of actinic radiation are useful in image-wise exposing the layer of photosensitive microcapsules 14 including ultraviolet radiation, infrared radiation, visible light, x-ray, and ion beam irradiation. Of course, the form selected is dependent upon the specific photosensitive composition selected. Any source of actinic radiation which can provide one of the foregoing forms of actinic radiation is useful in the image-wise exposure of the present invention. Preferably, the source of actinic radiation 44 provides broad band visible light. In FIG. 2, the source of actinic radiation 44 has been simplified for illustration purposes. Typically, a photomask (not shown in FIG. 2) or other means is used to provide the image information for exposure.

Figure 3:
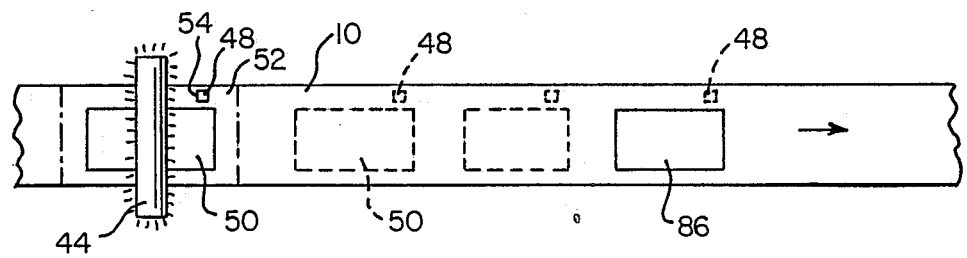
FIGS. 3 and 4 are top views of an imaging web showing the image areas and registration marks thereon.
Figure 4:
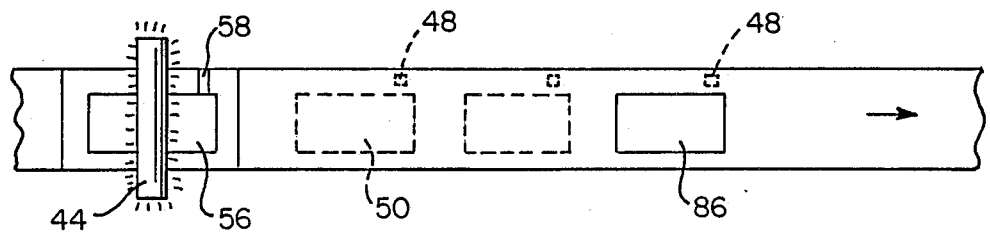

As an example of registration mark formation, a registration mark 48 as shown in FIG. 3 is preferably formed simultaneously with the image area at the exposure station 36. The exact location, shape, and size of the registration mark 48 can be varied as long as a detector can detect a difference between the registration mark 48 and the surrounding web area. Thus, it should be understood that the location, shape, and size of the registration mark 48 as shown in FIGS. 3 and 4 are for illustrative purposes only. Preferably, the registration mark 48 is formed in the border area between the edge of the imaging web 10 and the edge of the image area 50, rather than in the border area between the ends of adjacent image areas 50, so as to make the registration mark 48 more accessible to a detector.

As illustrated in FIG. 3, the same source of actinic radiation 44 can be used for both the image-wise exposure and the registration mark exposure As shown in FIG. 3, suitable means such as a baffle 52 is placed so as to define the border area. The baffle 52 has an aperture 54 which corresponds to the desired location, shape, and size of the registration mark. As such, one exposure forms the image area 50 and the registration mark 48.

Although not illustrated, the registration mark 48 can also be formed before or after the image area 50 is formed and before, at, or after the exposure station. This method is less preferred because each registration mark may not necessarily be formed at precisely the same location relative to the image area due to the need to move the web between exposure locations if the registration mark is not formed at the exposure station. Also, if the registration mark 48 is formed at the same exposure station as the image area 50, the same source of actinic radiation can be used for both exposures. If the registration mark 48 is formed at a different location, another source of actinic radiation may be required. Comparable to the image-wise exposure, the form of actinic radiation selected for the separate registration mark exposure depends upon the specific photosensitive composition used. Preferably, a source of actinic radiation which provides visible light is used.

In the embodiment of FIG. 3, the registration mark 48 is formed by exposing a portion of the border area to actinic radiation so that the portion undergoes a color or reflection change. Alternatively, the registration mark 48 can be formed by exposing all but a portion of the border area to actinic radiation so that the exposed area undergoes a color or reflection change as shown in FIG. 4.

In one example of this technique, the same source of actinic radiation 44 is used for both the image-wise exposure and the non-registration mark border area exposure. As shown in FIG. 4, a photomask 56 is used to provide the image information for exposure. The photomask 56 has an extension 58 which shields the registration mark area from the actinic radiation Extension 58 has a location, shape, and size which corresponds to the registration mark to be formed It should be understood that extension 58 could also be separate from the photomask 56 as long as extension 58 blocks a portion of the border from the actinic radiation. As such, one exposure forms the image area 50 and the registration mark 48, which is the unexposed portion of the border. It should be understood that the registration mark 48, in the embodiment of FIG. 4, can also be generated before or after the formation of the image area 50 and before or after the exposure station.

Referring back to FIG. 2, belt 38 and hence imaging web 10 is driven at the exposure station 36 by motor 60, which is in turn connected to a toothed drive belt 62 passing around a toothed pulley 64 mounted at one end of roller 40.

As web 10 leaves the exposure station 36, it is directed into a web reservoir 66. There, the exposed imaging web 10 is accumulated, kept under tension by an appropriate dancer roll 68. Dancer roll 68 may be spring loaded by spring means 70 so as to provide sufficient downward force for maintaining web tension. Further details regarding the dancer roll 68 and its construction may be seen by reference to commonly assigned U.S. Pat. application Ser. No. 039,879, filed Apr. 20, 1987. While the construction shown therein is preferred for this apparatus, any appropriate dancer roll construction may be used.

In some applications, the direction of movement of the web 10 in the web reservoir 66 is reversed so that the unexposed area between the last area image-wise exposed and the next area to be image-wise exposed is small. In this application, the registration mark is formed on the perimeter of the last area image-wise exposed or in the surrounding border area; the registration mark can be formed either before or at the image-wise exposure station and either simultaneously with the last area image-wise exposed or at a different time. Although not illustrated, in this situation, a detector is situated between the web reservoir 66 and the exposure station 36. The web 10 is reversed until the detector senses the registration mark. A motor control means receives output from the detector upon the detection of the registration mark. The motor control means is in turn connected to the motor 60. The motor control means can be any appropriate control means for use with the motor 60 selected. To understand the present invention, it is sufficient to note that output from the detector is used to instruct motor control means to cause motor 60 to shut off so that the next area to be image-wise exposed can be exposed.

Upon emerging from reservoir 66, imaging web 10 is passed around a guide roll 72. A detector 74 is positioned above the imaging web 10 after the web 10 passes around the guide roll 72. Any conventionally used detector is useful in the present invention as long as the detector does not damage the imaging web and can sense a difference between the registration mark and the surrounding border area. Preferably, an optical detector is used. A typical optical detector comprises a light source and a photoresponsive surface. The light source and the photoresponsive surface can be located together or spaced apart. A low level infrared detector is preferred. If the image area is in or near the deflector, either a baffle should be used to shield the image from the detector light or a detector should be used which has a wavelength which will not cause hardening of the photosensitive composition.

The imaging web 10 proceeds past the optical detector 74 and into the developer station 76. Typically, the web 10 travels toward a pair of parallel developer rolls 78 and 80 which define a pressure nip therebetween. Rolls 78 and 80 are counterrotated to draw imaging web 10 through the nip, and are specifically constructed to provide a uniform pressure across the entire length of the nip. Further details regarding rolls 78 and 80 can be seen by reference to commonly assigned U.S. Pat. No. 4,768,050 . Other useful means for rupturing microcapsules are disclosed in commonly assigned U.S. Pat. No. 4,448,516; 4,533,615; 4,578,340; 4,592,986; and U.S. Ser. No. 010,922, filed Feb. 5, 1987.

Receiving output from detector 74 upon the detection of a registration mark 48 is an appropriate feed control means 82. Feed control means 82 is in turn connected to the receiver sheet feed means 84. Feed control means 82 may be any appropriate control means for use with the particular receiver sheet feed means 84 selected. To understand the present invention, it is sufficient to note that output from detector 74 is used to instruct feed control means 82 to cause receiver sheet feed means 84 to supply a receiver sheet 86 from a storage bin 88 to the developer station 76. The receiver sheets 86 may be developer sheets, as shown in FIG. 1, which carry a layer of developer material which can react with the color former released upon the rupture of the microcapsules to produce a colored image Alternatively, the receiver sheets 86 may be sheets of plain bond paper which receive the dye product of a color former and a developer material released from a self-contained imaging web.

Receiver sheet feed means 82 directs the receiver sheet 86 into an appropriate guide 90 which directs the receiver sheet 86 to the entrance to the nip between pressure rollers 78 and 80. Assuming that the receiver sheet feed means 84 has withdrawn a receiver sheet 86 from the storage bin 88 at the appropriate time, receiver sheet 86 will be delivered to the nip between pressure rollers 78 and 80 in proper registration with the image area 50 of imaging web 10 as shown in FIGS. 3 and 4. The receiver sheet 86 and imaging web 10 then pass through the nip in superposed condition whereupon the microcapsules 14 on the imaging web 10 are ruptured so that the finished image is formed on the receiver sheet 86. Upon emerging from pressure rollers 78 and 80, the used imaging web 10 is collected on a take-up roll 92 while the receiver sheet 86 is directed into an appropriate receiver bin 94 or the like.

Having described the invention in detail and by reference to preferred embodiments thereof, it will be apparent that modifications and variations are possible without departing from the scope of the invention defined in the appended claims.

What is claimed is:

1. A method of registering to an imaging web moving within an imaging web handling apparatus along an imaging web path, said imaging web comprising a support having a coating of photosensitive microcapsules on the surface thereof, said photosensitive microcapsules having an internal phase of a color former and a photosensitive composition sensitive to radiation of at least a first wavelength and insensitive to radiation of at least a second wavelength, the method comprising the steps of:

forming a registration mark on said imaging web by exposing a first portion of said imaging web to actinic radiation of said first wavelength so that said first portion undergoes a color or reflection change with respect to the remaining second portion of said imaging web;

detecting said registration mark by directing onto said moving imaging web radiation of said second wavelength, and receiving onto a photoresponsive surface said radiation of said second wavelength reflected from said imaging web, thereby detecting said color or reflection change without further exposing said imaging web; and in response to detecting said registration mark, performing an operation on said imaging web.

2. The method of claim 1 wherein said first portion is small relative to said second portion and said registration mark is formed by exposing said first portion of said image area perimeter or said border area to actinic radiation so that said first portion undergoes a color or reflection change.

3. The method of claim 1 wherein said second portion is small relative to said first portion and said registration mark is formed by exposing said first portion of said image area perimeter or said border area to actinic radiation so that said first portion undergoes a color or reflection change.

4. The method of claim 1 which further comprises the step of advancing said web between said registration mark formation and said registration mark detection.

5. The method of claim 1 wherein said step of forming said registration mark is performed at said exposure station.

6. The method of claim 1 wherein said registration mark is formed in said border area between the edge of said imaging web and the perimeter of said image area.

7. The method of claim 5 wherein said step of performing an operation on said imaging web comprises feeding a receiver sheet into contact with said imaging web along said image area.

8. The method of claim 5 wherein said step of performing an operation on said imaging web comprises stopping said imaging web and image-wise exposing said imaging web to actinic radiation.

9. A transfer imaging process comprising the steps of:

imagewise exposing an imaging web, said imaging web comprising a support having a coating of photosensitive microcapsules on the surface thereof, said photosensitive microcapsules having an internal phase of a color former and a photosensitive composition sensitive to radiation of at least a first wavelength and insensitive to radiation of at least a second wavelength, to actinic radiation of said first wavelength at an exposure station to form an image area wherein said imagewise exposure defines a border area in said imaging web comprising the areas of said imaging web surrounded by said image area:

forming a registration mark by exposure of said web to actinic radiation of said first wavelength;

detecting said registration mark by directing onto said border area of said imaging web radiation of said second wavelength and receiving onto a photoresponsive surface radiation of said second wavelength reflected from said imaging web;

in response to detecting said registration mark, feeding a receiver sheet into contact with said imaging web along said image area; and following detecting of said registration mark, subjecting the entire surface of said imaging web to a uniform rupturing force such that said photosensitive microcapsules rupture and release said internal phase in accordance with said imagewise exposure to react with a developer material to produce an image.

10. The transfer imaging process of claim 9 wherein said step of forming a registration mark comprises exposing a portion of said image area perimeter or said border area to actinic radiation so that said portion undergoes a color or reflection change.

11. The transfer imaging process of claim 9 wherein said step of forming a registration mark comprises exposing all but a portion of said image area perimeter or said border area to actinic radiation so that said exposed area undergoes a color or reflection change.

12. The transfer imaging process of claim 9 which further comprises the step of advancing said web between said registration mark formation and said registration mark detection.

13. The transfer imaging process of claim 9 wherein said registration mark is formed simultaneously with said image-wise exposure.

14. The transfer imaging process of claim 13 wherein said registration mark is formed at said exposure station.

15. The transfer imaging process of claim 9 wherein said registration mark is formed in said border area between the edge of said imaging web and the perimeter of said image area.

16. The method of claim 1 further comprising exposing said imaging web at an exposure station to actinic radiation to define an image area and a border area, wherein forming of said registration mark is by exposing said first portion within said image area perimeter or said border area.

* * * * *